United States Patent [19]

Ishihara

[11] Patent Number: 5,646,536
[45] Date of Patent: Jul. 8, 1997

[54] METHOD FOR CALIBRATING CIRCUIT NETWORK MEASUREMENT DEVICES

[75] Inventor: Atsushi Ishihara, Hyogo, Japan

[73] Assignee: Hewlett-Packard Company, Palo Alto, Calif.

[21] Appl. No.: 504,181

[22] Filed: Jul. 19, 1995

[30] Foreign Application Priority Data

Aug. 24, 1994 [JP] Japan ................... 06-222655

[51] Int. Cl.$^6$ ................... G01R 27/00
[52] U.S. Cl. ................... 324/601; 324/638
[58] Field of Search ................... 324/601, 637, 324/638, 642, 639; 333/246, 263

[56] References Cited

U.S. PATENT DOCUMENTS

| | | | |
|---|---|---|---|
| 4,808,912 | 2/1989 | Potter et al. | 324/601 |
| 4,816,767 | 3/1989 | Cannon et al. | 324/601 |
| 5,321,364 | 6/1994 | Nukiyama | 324/601 |
| 5,442,296 | 8/1995 | Schiek et al. | 324/601 |

OTHER PUBLICATIONS

HP 4380S—RF Balanced Cable Evaluation Test System Product Overview– Mar. 1995– Hewlett–Packard Company.
HP 8753C—Network Analyzer Operating Manual—Jan. 1992– Ref. Section, Appendix to Chapter 5– Hewlett–Packard Company.
A Dual 6–Port Network Analyer Cronson & Susman IEEE NTFS International Microwave Symposium May 1980.
A New Procedure for System Calibration and Error Removal Franzen et al. Microwave Conference Aug. 1975.
An Automated Broadband System for Measurement of One Port Microwave Parameters Kormak Jul. 1976.
Six Port Automatic Network Analyzer Cronson IEEE Transactions vol. MTT–25 No. 12 Dec. 1977.

*Primary Examiner*—Kenneth A. Wieder
*Assistant Examiner*—Diep Do

[57] ABSTRACT

The purpose of a through calibration is to correct errors in transmission coefficients in both the forward and reverse directions between two measurement ports of a circuit network measurement device having many ports. If there are N measurement ports, error corrections of the transmission coefficients are necessary for all combinations of two measurement ports selected from N ports. The calibration method of this invention is one in which the calibration measurements are performed with n combinations, rather than all combinations, and calibration values for all combinations are obtained by calculation. The n combinations and their measurements may be performed by any combination that satisfies the following conditions: (A) there are triangular combinations of connected ports; (B) all of the other combinations of ports are linked with the triangular combination; and (C) in one combination among the triangular combinations, a measurement of the transmission coefficient in only one direction is sufficient.

3 Claims, 3 Drawing Sheets

FIRST CYCLE

SECOND CYCLE

THIRD CYCLE

METHOD FOR CALIBRATING CIRCUIT NETWORK MEASUREMENT DEVICES

FIELD OF THE INVENTION

This invention concerns circuit network measurement devices in general; and in particular, it concerns a method of "through" calibration, which is performed in order to correct errors in transmission coefficients between measurement ports of a circuit network measurement device that has many measurement ports.

BACKGROUND OF THE ART

FIG. 6 shows an example of a circuit network measurement device with many measurement ports; in this example, there are 8 ports. This arrangement is generally called an "S parameter test system" or "network analyzer system". These systems consist of a network analyzer 11, shown on top in the figure, and a lower test set 12. However, there are also devices in which both parts are combined into one apparatus. Here, we shall take the general separate-type S parameter test system as an example.

Test set 12 conducts measurement signals from a source in network analyzer 11 to a circuit being measured, separates the transmitted and reflected signals to measure the S parameters, and sends them to a receiver in the network analyzer. Transmission of measurement signals between the network analyzer and the test set is performed through four coaxial cables 13. In addition, although not shown in the figure, suitable cables also connect the network analyzer and the test set at their rear panels for power supply and control signals. Moreover, there are also cases in which the circuit network measurement device is controlled by a computer.

Connectors 14 on test set 12 serve as measurement ports (below, "measurement ports" are referred to as "ports"). The numbers placed on the connectors are the numbers of the ports. In measurements of the circuit network, when the circuit is connected directly to connectors 14 and measured, the connectors are the ports. However, the circuit network to be measured is rarely connected directly to connectors 14; generally, coaxial cables 15 are connected to connectors 14, and the circuit network to be measured is connected to connectors 16 at the front ends of coaxial cables 15. At such time, connectors 16 at the ends of cables 15 become the ports. Furthermore, in FIG. 6, only some of the coaxial cables are shown; the connectors on the test set side of the coaxial cables are omitted from the figure.

Among methods for calibrating this circuit network measurement device, the full two-port calibration method is known as the best method. Full two-port calibration consists of (a) one-port calibration, (b) isolation calibration, (c) through calibration, and (d) load match calibration. In a one-port calibration, three known impedances are prepared as standards; the port is calibrated by successively connecting these standards. The same calibration is also performed on the other ports. Ordinarily, the three known impedances used are open, short, and load.

Isolation calibration is performed in order to correct errors caused by signal leakage between the ports. Through calibration is performed to correct errors in transmission coefficients between the ports. Load match calibration is performed in order to correct errors produced by mis-matching when the ports receive the transmitted signals. The measurement values in these four calibrations are subjected to calculation processing to correct the errors. Details of a full two-port calibration method are given in the following reference: "Accuracy Enhancement Fundamentals—Characterizing Microwave Systematic Errors," HP 8753C Network Analyzer Operating Manual, Reference Section, Appendix to Chapter 5.

Not only the through calibration is a part of the full two-port calibration as mentioned above, but it is also performed independently.

The procedure for performing a through calibration is as follows: a through standard with a known transmission coefficient is connected between the ports and the transmission coefficient is measured; any error is corrected by the difference between the value of the through standard and the measured value. The through standard is generally a coaxial cable or coaxial connector with a negligible loss. However, in cases in which the connectors are connected directly to each other, as in the case in which the ports are APC7 connectors on the ends of the coaxial cables, the through standards are unnecessary.

In the calibration method described above, the only difference between the through calibration as part of the full two-port calibration and the through calibration performed independently is in the equation for correcting the errors. In the explanation given below, the equation for the through calibration performed independently is given, and the problems of prior art calibration methods are explained.

S parameters are used to display the characteristics of a circuit network at high frequencies. FIG. 4 shows a two-port circuit network. The incident wave, from port 1 in the figure to the circuit network, is designated as "a1", the reflected wave as "b1", the incident wave from port 2 to the circuit network as "a2", and the reflected wave as "b2". In this case, the relationship between these is expressed as shown in the following equation, using the S parameters:

$$\begin{bmatrix} b1 \\ b2 \end{bmatrix} = \begin{bmatrix} S11 & S12 \\ S21 & S22 \end{bmatrix} \begin{bmatrix} a1 \\ a2 \end{bmatrix}$$

The transmission coefficient of the signal from port 1 to port 2 is S21; it is expressed by the following equation:

$$S21 = \frac{b2}{a1} \bigg|_{a2=0}$$

The error model for the transmission coefficient S21 of the circuit network of FIG. 4 is shown by the signal flow diagram in FIG. 5. If the true value of the transmission coefficient of the circuit network is $S21a$ and the error of the measurement system is $Et$, the measured value $S21m$ becomes $$S21m = S21a \cdot Et$$

The through calibration is performed by connecting the through standard, which has the known value $S21as$ for the transmission coefficient, between the ports, and measuring S21. If this measured value is $S21ms$, the error $Et$ of the measurement system is expressed by the following equation:

$$Et = S21ms/S21as$$

Thus, if $Et$ is obtained beforehand by through calibration, the value $S21a$ in which the error of the measurement system is corrected can be obtained for any measurement. That is, the equation to correct the error becomes the equation below:

$$S21a = S21m/Et \qquad (A)$$

In the case in which the through calibration is performed for S12, for the opposite transmission direction from that of S21, the connections are switched: port 1 in the S21 measurement is connected to the source side of network analyzer 11, and port 2 is connected to the receiver side; port 2 in the S12 measurement is connected to the source side, and port 1 is connected to the receiver side. This change is performed in test set 12 by the logical control of the network analyzer. Further, there is no need to change the connections of the through standard.

Here, the case is considered in which through calibration is performed for all transmission directions in a circuit network measurement device, with n as the number of ports. The connection of the through standard must be performed $nC_2=n(n-1)/2$ times, the number of combinations when two are selected from n. Moreover, since the measurements are performed for both the regular and reverse directions, $n(n-1)$ measurements are performed.

Therefore, the problem with the prior art is that, as n becomes larger, the number of connections of the standard and the measurement time increase as the square, and the burden of the calibration measurement also becomes large.

OBJECT OF INVENTION

The purpose of this invention is to reduce the number of connections of calibration standards and the number of measurements in a through calibration that are performed by a circuit network measurement device with many ports.

SUMMARY OF INVENTION

This invention is a method by which, in a circuit network measurement device with n ports, through calibrations with respect to all combinations of the ports are obtained from the measured values obtained by the connections between n ports, by numerical calculations.

EXPLANATION OF SYMBOLS

Figure 1:
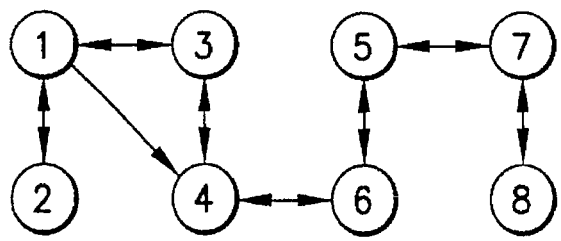
FIG. 1 is a diagram showing a first example of this invention.

1: port number
2: port number
3: port number
4: port number
5: port number
6: port number
7: port number
8: port number
11: network analyzer
12: test set
13: coaxial cable
14: coaxial connector
15: coaxial cable
16: coaxial connector

DETAILED DESCRIPTION OF THE INVENTION

N ports are numbered 1 to n. The transmission coefficients that can be measured when the through standard is connected to ports i and j are Sji and Sij. Since Sji is the product of the transmission coefficient Si on the source side and the transmission coefficient Rj on the receiver side, it follows that $$Sji = Si \cdot Rj$$

Similarly, $$Sij = Sj \cdot Ri$$

Next, it is shown inductively that Si and Ri can be separated in the form of a ratio, by measurements using n connections. First, consider the case of n=3. The standard is connected between ports 1 and 2 (this is referred to below as a "through connection"), and the following transmission coefficients are measured.

$$S21 = S1 \cdot R2$$

$$S12 = S2 \cdot R1$$

Similarly, from the through connection between ports 1 and 3, the transmission coefficients $$S31 = S1 \cdot R3$$

$$S13 = S3 \cdot R1$$

are measured, and from the through connection between ports 2 and 3, the transmission coefficients $$S32 = S2 \cdot R3$$

are measured. Here, $S23 = S3 \cdot R2$ is not measured.

From the equations above, the ratios shown in the following equations are obtained:

$$\begin{aligned} S1:S2:S3 &= (S1/S2):1:(S3/S2) \\ &= (S31/S32):1:(S13/S12) \end{aligned} \quad (B)$$

$$\begin{aligned} R1:R2:R3 &= (R1/R3):(R2/R3):1 \\ &= (S12/S32):(S21/S31):1 \end{aligned} \quad (C)$$

Moreover, since $$S2 \cdot R3 = S32, \quad (D)$$

S23, which was not measured, can be obtained by calculation as $$\begin{aligned} S23 = S3 \cdot R2 &= (S3/S2)(R2/R3)(S2 \cdot R3) \\ &= (S13/S12)(S21/S31) \, S32 \end{aligned}$$

The results up to this point are summarized in Table 1 below. The middle row in Table 1 shows the ratios of equation (B), and the bottom row shows the ratios of equation (C) multiplied by equation (D).

TABLE 1

| PORT | 1 | 2 | 3 |
|---|---|---|---|
| Coefficients of source | S 1/S 2 = S 31/S 32 | 1 | S 3/S 2 = S 13/S 12 |

TABLE 1-continued

| PORT | 1 | 2 | 3 |
|---|---|---|---|
| Coefficients of receiver | S 2 · R 1 = S 12 | S 2 · R 2 = S 21 · S 32/S 31 | S 2 · R 3 = S 32 |

The values of the middle row or the bottom row of table 1 have no meaning, but the product of the middle and bottom rows expresses the transmission coefficient between any arbitrary port.

It is shown above that when n=3, the transmission coefficients of all of the combinations can be obtained from 3 connections and 5 measurements.

Next, the same process is performed in the case of n ports. If the ratios of the coefficients on the source side S1:S2:S3: . . . :Sn, the ratios of the coefficients of the receiver side R1:R2:R3: . . . :Rn, and a certain transmission coefficient Shg=Sg·Rh ($1 \leq g \leq n$, $1 \leq h \leq n$, $g \neq h$), the transmission coefficient Sji between any arbitrary ports can be obtained from the following calculation. When n=3, as was mentioned above, it can be obtained by calculation.

$$Sji = Si \cdot Rj = (Si/Sg)(Rj/Rh)(Sg \cdot Rh)$$

In this state, let us consider the case of n+1 ports, with 1 port added. Making a through connection between port (n+1) and port m ($1 \leq m \leq n$), $$Sm(n+1) = Sn+1 \cdot Rm$$

$$S(n+1)m = Sm \cdot Rn+1$$

is measured. The ratio of Sn+1 to any arbitrary Sg is obtained as $$\begin{aligned} Sn+1/Sg &= (Sn+1 \cdot Rm)/(Sg \cdot Rm) \\ &= (Sn+1 \cdot Rm)/\{(Sg \cdot Rh)(Rm/Rh)\} \end{aligned}$$

The numerator on the right side of this equation is the added measured value; the denominator is a value which is already known from the case of n ports. Similarly, the ratio of Rn+1 to any arbitrary Rh is obtained by calculation from $$\begin{aligned} Rn+1/Rh &= (Sm \cdot Rn+1)/(Sm \cdot Rh) \\ &= (Sm \cdot Rn+1)/\{(Sm/Sg)(Sp \cdot Rh)\} \end{aligned}$$

Therefore, the ratios of the transmission coefficients on the source side S1:S2:S3: . . . :Sn+1, the ratios of the transmission coefficients on the receiver side R1:R2:R3: . . . :Rn+1, and a certain transmission coefficient Shg=Sg·Rh ($1 \leq g \leq n+1$, $1 \leq h \leq n+1$, $g \neq h$), are obtained. Consequently, as in the case of n ports, the transmission coefficient Sji between arbitrary ports can be obtained by calculating $$Sji = Si \cdot Rj = (Si/Sg)(Rj/Rh)(Sg \cdot Rh)$$

Therefore, even if the number of ports is increased from n to (n+1), if one connection is added and two measured values are obtained, the transmission coefficients for all combinations can be obtained by calculation.

To summarize, if measurements are performed with through connections satisfying the following conditions A–C, it is possible to obtain calibrated values of the transmission coefficients for all combinations of ports.

(A) There are triangular combinations (among any arbitrary 3 ports, e.g., among ports 1, 2, and 3, the combinations 1 and 2, 2 and 3, and 3 and 1).

(B) All of the combinations, other than the aforementioned ones, are directly or indirectly linked with the aforementioned triangular combination; there are no isolated ports (e.g., in the example above, the combination of ports 6 and 5 may be linked to port 3 of the triangular combinations through the combination of ports 5 and 4 and the combination of ports 4 and 3).

(C) In one combination among the triangular combination, a measurement of the transmission coefficient in only one direction is sufficient.

Under these conditions, the number of combinations equals the number of ports n.

FIG. 1 shows an example of through connections that satisfy conditions A–C of combinations of ports. In the figure, an example of 8 ports is shown; the circles represent the ports, and the figures represent the port numbers. Moreover, the lines connecting the ports of the figure show through connections, and the arrows show the directions in which the transmission coefficients are measured.

In FIG. 1, the combinations of ports 1 and 3, 3 and 4, and 4 and 1 form a triangular shape. Moreover, the other combinations, e.g., the combination of ports 7 and 8, are linked with port 4 of the triangular combination through the combination of ports 7 and 5, the combination of ports 5 and 6, and the combination of ports 6 and 4. In one of the combinations within the triangular shape (i.e. the combination of ports 1 and 4), a measurement is performed in only one direction.

As shown in the figure, there are 8 connections and 15 measurements. In the prior art, since all of the combinations are connected, the number of connections would be 28 and the number of measurements 56.

Next, the method of performing the eight through connections and measurements of FIG. 1 will be discussed. First, one connection shown in the figure is made, and the transmission coefficients are measured; the connection is changed to the next connection, and the measurements are performed again. This is done eight times in succession. This is a simple, easily understood method.

Figure 2A:
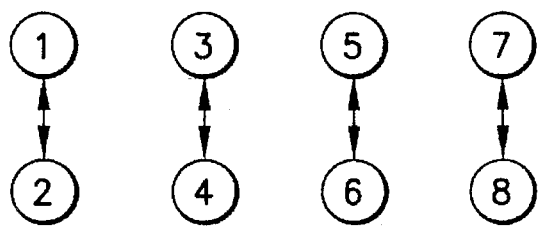
FIGS. 2a–2c are diagrams showing an example of performing in groups the connections of the first example of this invention.
Figure 2B:
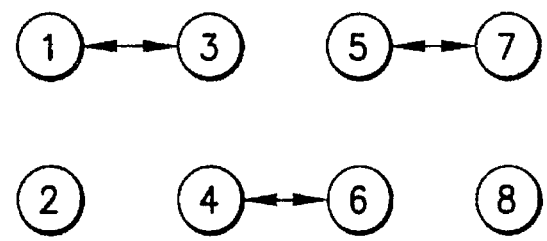
Figure 2C:
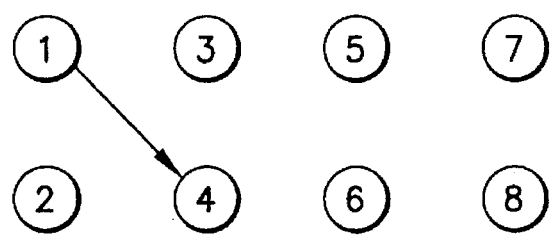

Next, an efficient method is shown in FIGS. 2a, 2b and 2c. In this method, the eight connections are divided into three connection groups. First four through standards are prepared. In the first connection, ports 1 and 2, 3 and 4, 5 and 6, and 7 and 8 are through-connected; the measurements are performed by automatically switching the combinations of the ports and the measurement directions, in succession, by means of logical control in the circuit network measurement device. In the second connection group, ports 1 and 3, 4 and 6, and 5 and 7 are through-connected, and the measurements are performed automatically in the same manner as in the first group. In the third measurement, a measurement in only one direction is performed with a through connection between ports 1 and 4. This method does not change the total number of connections and measurements, but the combinations of the ports connected is simple within each group, and since only three arrangements of connections are needed, the burden of the work and the possibility of mistakes are reduced.

Figure 3:
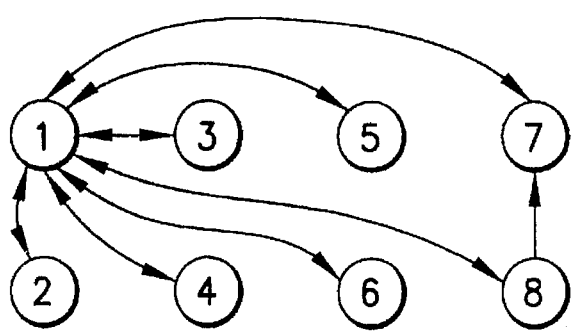
FIG. 3 is a diagram showing a second example of this invention.
Figure 4:
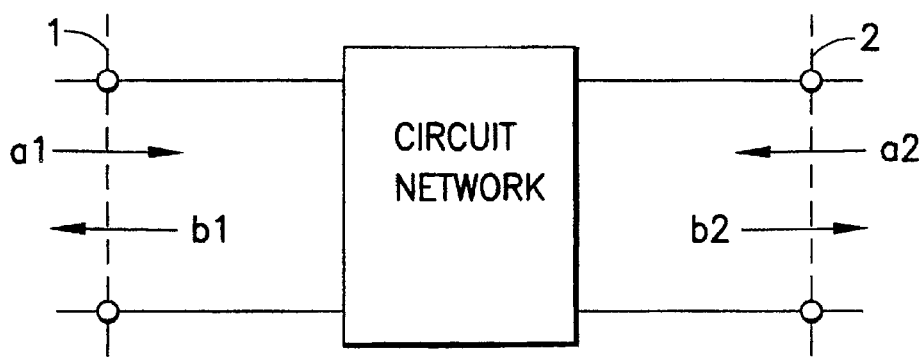
FIG. 4 is a diagram showing a two-port circuit.
Figure 5:
FIG. 5 is a diagram showing an error model of the transmission coefficients.
Figure 6:
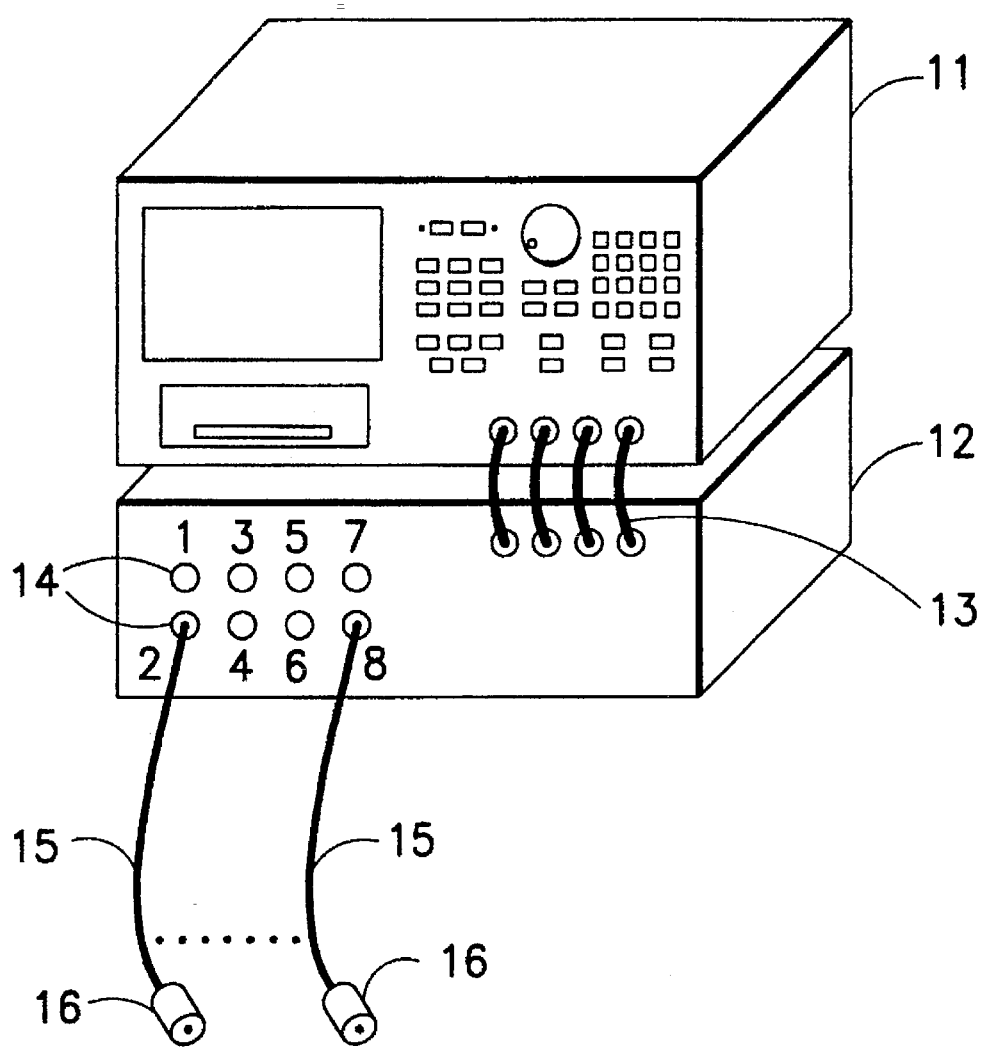
FIG. 6 is a diagram showing an example of a circuit network measurement device with many measurement ports.

Next, a second example of through connections satisfying the conditions of the port combinations of this invention is shown in FIG. 3. In this method, the connections between port 1 and all of the other ports are repeated in succession, and a connection between ports 7 and 8 is added to form the triangular shape. Here, also, there are a total of 8 connections and 15 measurements.

Examples of this invention have been described above, but any combinations that satisfy the aforementioned conditions (A), (B), and (C) may be used in connecting the ports and performing the measurements; one is not limited to the combinations shown in these examples. Moreover, the order in which the connections and measurements are performed is not limited. In addition, the arrangement, etc., of the circuit network measurement device is not limited; if desired, changes in the make-up are allowed as long as the concept of this invention is not lost.

Effectiveness of Invention

By means of this invention, the number of connections necessary for the through calibration of a circuit network measurement device provided with many ports and the measurement time for calibration are greatly reduced. In the case of n ports, the number of connections $n(n-1)/2$ may be reduced to n, and the number of measurements $n(n-1)$ is reduced to $2n-1$. As shown in the examples, in the case of 8 ports, these numbers are reduced to 30% or less (of the numbers in the prior art method). Furthermore, the correction coefficients obtained by using this method can be arranged in a form in which the source and receiver sides of the ports are separated. Therefore, the amount of memory needed can be greatly reduced, compared to the case in which the correction coefficients for all the combinations are stored in the memory of the calculation control device. Thus, the method of this invention has practical advantages over the conventional method.

What is claimed is:

1. A method for using a through calibration procedure to correct transmission coefficients between N measurement ports of a circuit network measurement device, where N is at least three, said method comprising the steps of:

(a) measuring transmission coefficients between N combinations of measurement ports and determining error corrections therefrom; and (b) determining by calculation, error corrections of transmission coefficients for all combinations of the N measurement ports from results obtained in step a.

2. A calibration method as recited in claim 1, wherein all of said N measurement ports become constituent elements of at least one combination of measurement ports; all of the combinations are linked so that at least one measurement port of a pair of measurement ports constituting one combination also forms a combination with at least one measurement port other than its partner in said combination; and one triangular linkage of ports is formed among ports that are linked.

3. A calibration method in accordance with claim 2 wherein in said combinations in which transmission coefficient measurements are performed between pair of measurement ports, in one combination among the combinations forming the aforementioned triangular linkage, a transmission coefficient is measured in only one direction and the transmission coefficients in other combinations are measured in both directions.

* * * * *